United States Patent [19]
Akram et al.

[11] Patent Number: 6,107,109
[45] Date of Patent: *Aug. 22, 2000

[54] METHOD FOR FABRICATING A SEMICONDUCTOR INTERCONNECT WITH LASER MACHINED ELECTRICAL PATHS THROUGH SUBSTRATE

[75] Inventors: Salman Akram, Boise; Warren M. Farnworth, Nampa; Alan G. Wood, Boise, all of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,965

[22] Filed: Dec. 18, 1997

[51] Int. Cl.⁷ .......................... G01R 31/26; H01L 21/66; H01L 21/4763; H01L 21/44

[52] U.S. Cl. .............................. 438/15; 438/618; 438/666

[58] Field of Search ............... 438/15, 613, 618, 438/620, 667, 675, 928, 666; 257/621, 698, 737, 738, 774, 780; 324/765

[56] References Cited

U.S. PATENT DOCUMENTS

| | | | |
|---|---|---|---|
| 5,046,239 | 9/1991 | Miller et al. | 29/852 |
| 5,063,177 | 11/1991 | Geller et al. | 437/209 |
| 5,172,050 | 12/1992 | Swapp | 324/158 P |
| 5,229,647 | 7/1993 | Gnadinger | 257/785 |
| 5,236,551 | 8/1993 | Pan | 156/643 |
| 5,249,450 | 10/1993 | Wood et al. | 72/359 |
| 5,420,520 | 5/1995 | Anschel et al. | 324/754 |
| 5,426,072 | 6/1995 | Finnila | 438/107 |
| 5,483,741 | 1/1996 | Akram et al. | 29/846 |
| 5,487,999 | 1/1996 | Farnworth | 437/7 |
| 5,528,080 | 6/1996 | Goldstein | 257/741 |
| 5,541,525 | 7/1996 | Wood et al. | 324/755 |
| 5,578,526 | 11/1996 | Akram et al. | 437/209 |
| 5,592,736 | 1/1997 | Akram et al. | 29/842 |
| 5,607,818 | 3/1997 | Akram et al. | 430/311 |
| 5,633,122 | 5/1997 | Tuttle | 430/317 |
| 5,634,267 | 6/1997 | Farnworth et al. | 29/840 |
| 5,674,785 | 10/1997 | Akram et al. | 437/217 |
| 5,686,317 | 11/1997 | Akram et al. | 437/8 |
| 5,716,218 | 2/1998 | Farnworth et al. | |
| 5,781,022 | 7/1998 | Wood et al. | |
| 5,783,461 | 9/1998 | Hembree | |
| 5,801,452 | 9/1998 | Farnworth et al. | |
| 5,815,000 | 9/1998 | Farnworth et al. | |
| 5,834,945 | 11/1998 | Akram | 324/755 |
| 5,869,974 | 2/1999 | Akram et al. | |
| 5,878,485 | 3/1999 | Wood et al. | |
| 5,896,036 | 4/1999 | Wood et al. | |
| 5,915,977 | 6/1999 | Hembree et al. | |
| 5,929,647 | 7/1999 | Akram et al. | |
| 5,931,685 | 8/1999 | Hembree et al. | |
| 5,962,921 | 10/1999 | Farnworth et al. | |
| 6,013,948 | 1/2000 | Akram et al. | |

*Primary Examiner*—Tuan H. Nguyen
*Assistant Examiner*—Nema Berezny
*Attorney, Agent, or Firm*—Stephen A. Gratton

[57] ABSTRACT

An interconnect for semiconductor components such as dice, wafers and chip scale packages is provided. The interconnect includes a substrate, and patterns of contacts formed on a face side of the substrate adapted to electrically engage external contacts (e.g., bond pads, solder bumps) on the components. The interconnect also includes insulated conductive members through the substrate, which provide direct electrical paths from the interconnect contacts to a backside of the substrate. The conductive members can be formed by laser machining openings in the substrate, and then filling the openings with a conductive material (e.g., metal, conductive polymer). The conductive members can also include pads with contact balls, configured for electrical interface with a test apparatus, such as test carrier or wafer handler. The interconnect can be used to construct test systems for testing semiconductor components, or to construct chip scale packages and multi chip modules.

30 Claims, 6 Drawing Sheets

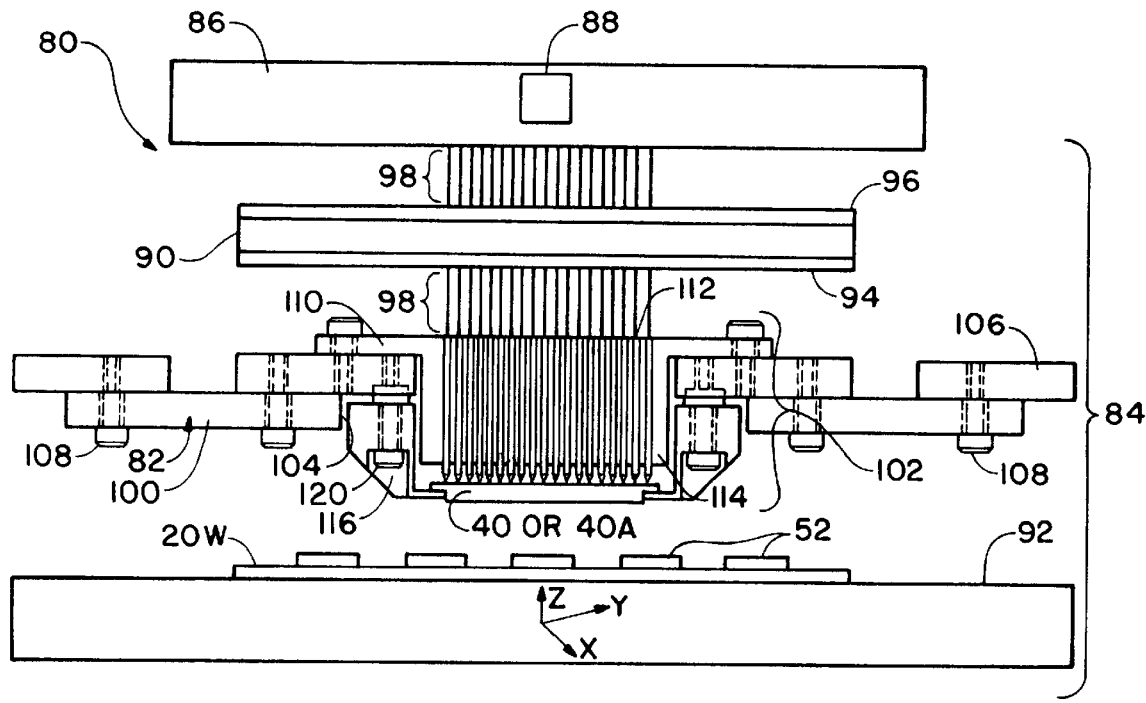
FIGURE 7
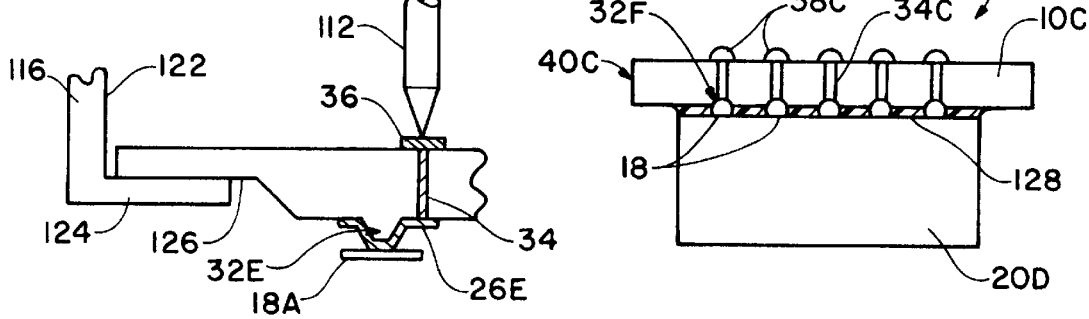
FIGURE 7A
FIGURE 8
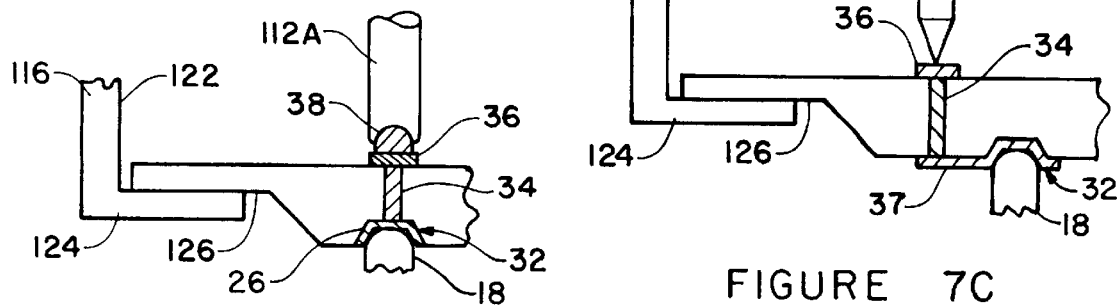
FIGURE 7B
FIGURE 7C

METHOD FOR FABRICATING A SEMICONDUCTOR INTERCONNECT WITH LASER MACHINED ELECTRICAL PATHS THROUGH SUBSTRATE

FIELD OF THE INVENTION

This invention relates generally to semiconductor manufacture, and specifically to an interconnect having laser machined contacts for electrically engaging external contacts on semiconductor components such as dice, wafers and chip scale packages.

BACKGROUND OF THE INVENTION

Semiconductor components include external contacts that allow electrical connections to be made from the outside to the integrated circuits contained on the components. A semiconductor die, for example, includes patterns of bond pads formed on a face of the die. At the wafer level, the bond pads are used for probe testing the integrated circuits on the die. At the die level, the bond pads are used for testing, and also for making electrical connections, such as wire bonds, for packaging. Typically, the bond pads comprise planar aluminum pads, or alternately solder bumps on solder wettable pads.

Semiconductor packages, such as chip scale packages, also include external contacts. One type of chip scale package includes solder balls arranged in a dense array, such as a ball grid array (BGA), or fine ball grid array (FBGA). The solder balls can be mounted on a substrate attached to a face of the die contained in the package. Metal traces, or other conductive elements associated with the substrate, form separate electrical paths between the solder balls on the substrate, and the bond pads on the die.

With these types of semiconductor components, interconnects can be used to make electrical connections to the external contacts on the components. A wafer probe card is one type of semiconductor interconnect. The probe card makes electrical connections between external contacts on a wafer under test, and test circuitry associated with a wafer handler.

Another type of semiconductor interconnect is adapted to electrically engage unpackaged dice, or chip scale packages, packaged within a test carrier. The test carrier interfaces with a burn-in board, or other testing apparatus, adapted to apply test signals to the dice contained within the test carrier. This type of interconnect is described in U.S. Pat. No. 5,686,317 to Akram et al., and in U.S. Pat. No. 5,487,999 to Farnworth et al. A representative test carrier is described in U.S. Pat. No. 5,541,525 to Wood et al.

Yet another type of interconnect can be used to fabricate multi chip modules and other electrical assemblies. For example, a conventional multi chip module includes an interconnect formed of ceramic material or a glass filled resin. A multi chip module with a silicon interconnect is described in U.S. Pat. No. 5,578,526 to Akram et al.

In each of these applications the interconnect includes contacts adapted to electrically engage the external contacts on the semiconductor component. With a conventional needle probe card the contacts comprise probe needles. With an interconnect used with a test carrier as described above, the interconnect contacts can comprise projections formed on a silicon substrate and covered with a conductive layer. Interconnect contacts for multi chip modules can be configured to allow the dice to be flip chip mounted, or chip on board mounted, to the substrate.

One problem with making electrical connections to external contacts on semiconductor components is that with advances in semiconductor manufacture, the size and spacing of the external contacts is decreasing, and the total number of external contacts on a single component is increasing. A semiconductor die, or chip scale package, can include a hundred, or more, external contacts each having a diameter of only about 10 mils, and a pitch of only about 30 mils. A semiconductor wafer can include thousands of external contacts.

Making physical and electrical contact with small, densely spaced, external contacts on a semiconductor component requires small, densely spaced interconnect contacts. Also, the external contacts typically include a native oxide layer that must be penetrated by the interconnect contacts to make low resistance electrical connections. In addition, the interconnects must include separate electrical paths, such as conductive traces, to each interconnect contact. Because of the required size and spacing of the interconnect contacts complex electrical paths must be formed on the interconnects. Signal delays and high resistivity can result from complex routing of electrical paths on the interconnects. Electrical problems, such as cross talk, and parasitic signals, can also occur between the interconnect contacts, and between associated electrical paths on the interconnect.

The present invention is directed to an improved interconnect having contacts adapted to make reliable electrical connections to small, closely spaced external contacts on semiconductor components.

SUMMARY OF THE INVENTION

In accordance with the present invention, an improved interconnect for semiconductor components, and a method for fabricating the interconnect are provided. The interconnect, broadly stated, comprises: a substrate; patterns of interconnect contacts on a face of the substrate, configured to electrically engage external contacts on the components; and conductive members in the substrate for providing direct electrical paths from the interconnect contacts to a backside of the substrate.

The locations of the interconnect contacts matches the locations of the external contacts on the semiconductor components. For electrically engaging bumped external contacts, such as solder balls, the interconnect contacts comprise recesses covered with conductive layers. For electrically engaging planar external contacts, such as thin film bond pads, the interconnect contacts comprise projections covered with conductive layers. In either embodiment, the interconnect contacts can include penetrating members adapted to penetrate native oxide layers on the external contacts.

The conductive members of the interconnect comprise openings in the substrate and a conductive material, such as a metal, or a conductive polymer, deposited within the openings. The openings can be formed with a desired size and pitch using a laser machining process, and then insulated using a deposition process, or an oxidation process. The conductive members can also include external pads, and contact balls on the backside of the interconnect. The pads and contact balls facilitate electrical interface between the interconnect, and a mating electrical component, such as a test carrier, or a probe card fixture of a wafer handler. In addition, a pitch of the pads and contact balls on the backside of the interconnect, can exactly match a pitch of the interconnect contacts on the face of the interconnect.

The interconnect can be used with the test carrier to provide a test system for testing singulated dice and chip scale packages. Alternately, the interconnect can be used with a wafer handler to provide a test system for testing semiconductor wafers. Still further, the interconnect can be used to construct chip scale packages, and electronic assemblies, such as multi chip modules.

BRIEF DESCRIPTION OF THE DRAWINGS

FIG. 6A is an end view of the test carrier taken along line 6A—6A of FIG. 6;

FIG. 6B is a bottom view of the test carrier taken along line 6B—6B of FIG. 6;

FIGS. 6C—6G are enlarged schematic cross sectional views taken along section lines (6C–6G)—(6C–6G) of FIG. 6A illustrating different methods for mounting the interconnect to a base of the carrier;

FIG. 7 is a schematic cross sectional view of a wafer level test system that includes an interconnect constructed in accordance with the invention;

FIGS. 7A–7C are enlarged schematic cross sectional views of a portion of the wafer level test system illustrating electrical interface with different embodiments of the interconnect;

FIG. 8 is a schematic cross sectional view of a chip scale package that includes an interconnect constructed in accordance with the invention.

DETAILED DESCRIPTION OF THE PREFERRED EMBODIMENTS

Figure 1A:
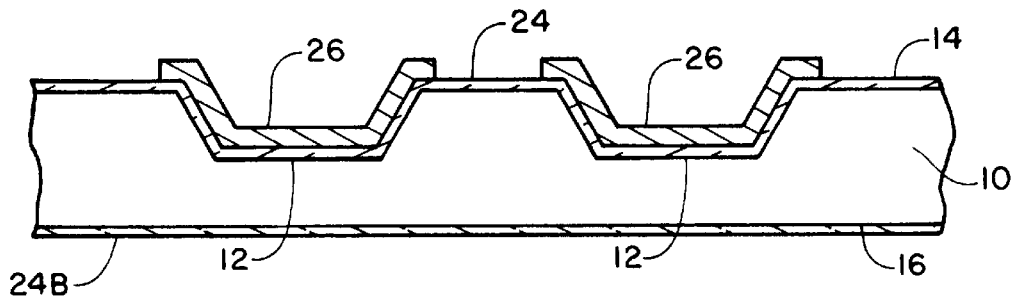
FIGS. 1A–1D are schematic cross sectional views illustrating a method for fabricating an interconnect in accordance with the invention.

Referring to FIGS. 1A–1D, steps in a method for fabricating an interconnect in accordance with the invention are illustrated. As shown in FIG. 1A, a substrate 10 can be provided. Preferably, the substrate 10 comprises a wafer of material on which multiple interconnects will be fabricated using semiconductor circuit fabrication techniques, and then singulated by cutting the wafer. Such a process is referred to as a wafer level fabrication process.

In the embodiment illustrated in FIGS. 1A–1D, the substrate 10 comprises a semiconductor material such as monocrystalline silicon, germanium, silicon-on-glass, or silicon-on-sapphire. In other embodiments to be subsequently described, the substrate 10 can comprise a ceramic material, or a glass filled resin material, such as FR-4.

The substrate 10 includes a face side 14 and an opposing backside 16. The face side 14 and backside 16 of the substrate are planar surfaces generally parallel to one another. A representative thickness of the substrate 10 can be from about 12 mils to 38 mils. Initially, patterns of recesses 12 can be formed on the face side 14 of the substrate 10. Preferably the recesses 12 are etched, but can also be formed using a laser, or using a machining process.

The recesses 12 can be etched by forming a mask (not shown) on the substrate 10, such as a photopatterned resist mask, or a hard mask, and then etching the substrate 10 through openings in the mask, using a wet or dry etchant. The etch process can be either anisotropic or isotropic. With an anisotropic etch process, the recesses 12 will have planar sidewalls, sloped at an angle of about 54.6° with respect to the face side 14 of the substrate 10, substantially as shown in FIG. 1A. One suitable etchant for performing an anisotropic etch of the substrate 10 is a solution of $KOH:H_2O$. With an isotropic etch process, the recesses 12 will have curved sidewalls (not shown). One suitable etchant for performing an isotropic etch of the substrate 10 is a mixture of HF, $HNO_3$ and $H_2O$.

A size and shape of the recesses 12 will be determined by the openings in the etch mask used to etch the substrate 10. The size and shape of the recesses 12 corresponds to a size and shape of external contacts 18 (FIG. 3) on a semiconductor component 20 (FIG. 3) to be electrically engaged by the interconnect. In the illustrative embodiment, the external contacts 18 comprise metal bumps on a die, or a chip scale package. In addition, the external contacts can be arranged in a dense array, such as a ball grid array (BGA), or fine ball grid array (FBGA).

Figure 3A:
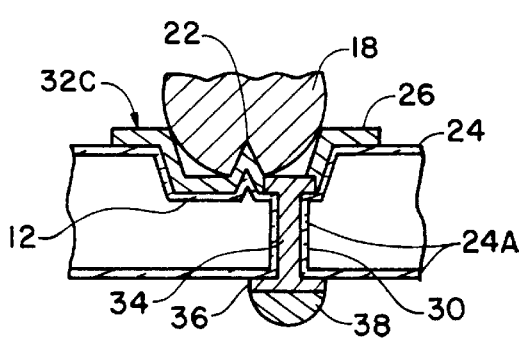
FIG. 3A is an enlarged schematic cross sectional view of an alternate embodiment interconnect contact having a penetrating member.
Figure 3:
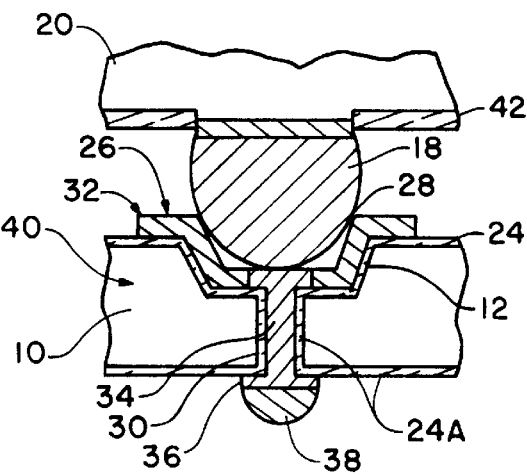
FIG. 3 is an enlarged schematic cross section view taken along section line 3—3 of FIG. 2 illustrating an interconnect contact electrically engaging a bumped external contact on a semiconductor component.

The recesses 12 are sized and shaped to retain and electrically engage the external contacts 18 (FIG. 3). A representative diameter, or width, of the recesses 12 can be from 2 mils to 50 mils or more. This diameter can be less than a diameter of the external contacts 18 so that only portions of the external contacts 18 will be contacted. A depth of the recesses 12 will be determined by an endpoint of the etch process. A representative depth for the recesses 12 can be from 0.25 mils to 25 mils or greater. Again this depth can be less than a height of the external contacts 18, so that only portions of the external contacts will be contacted. A pitch or spacing of the recesses 12 will exactly match a pitch or spacing of the external contacts 18 (FIG. 3) on the component (FIG. 3). A representative pitch or spacing between the recesses 12 can be from about 6 mils to 50 mils or greater.

Figure 2:
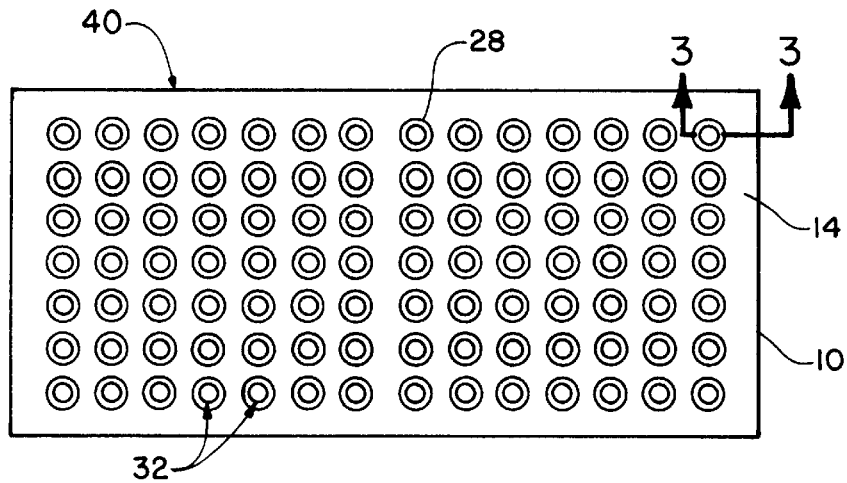
FIG. 2 is a plan view of the completed interconnect taken along section line 2—2 of FIG. 1D and illustrating interconnect contacts on a substrate of the interconnect.
Figure 2A:
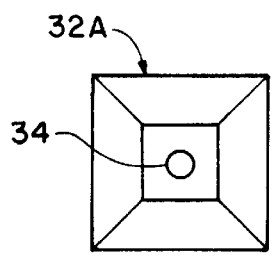
FIG. 2A is a enlarged plan view of an alternate embodiment interconnect contact having a square peripheral configuration.
Figure 2B:
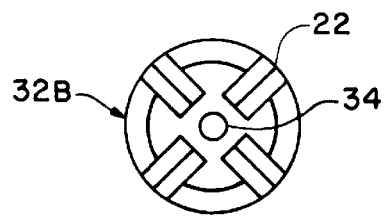
FIG. 2B is an enlarged plan view of an alternate embodiment interconnect contact having a pattern of penetrating members.

For forming the interconnect contacts 32 shown in FIG. 2, the recesses 12 have a generally circular peripheral configuration. For the interconnect contact 32A shown in FIG. 2A, the recesses 12 have a generally square (or rectangular) peripheral configuration. For the interconnect contact 32B shown in FIG. 2B, the recesses 12 can include penetrating members 22 adapted to penetrate the bumped external contacts 18 (FIG. 3).

As also shown in FIG. 1A, following formation of the recesses 12, an insulating layer 24 can be formed on the surface of the face side 14 of the substrate 10, and on the surfaces of the recesses 12. At the same time an insulating layer 24B can be formed on the backside 16 of the substrate 10. The insulating layer 24 functions to insulate a bulk of the substrate 10 from conductive layers 26 to be subsequently formed on the substrate 10. The insulating layer 24B functions to insulate the bulk of the substrate 10 from components to be subsequently formed on the backside 16 of the substrate 10. The insulating layers 24 and 24B can be an insulating material, such as $SiO_2$, or $Si_3N_4$, deposited to a desired thickness using CVD, or other deposition process. A $SiO_2$ layer can also be grown on exposed surfaces of the substrate 10 using an oxidizing atmosphere such as steam and $O_2$ at an elevated temperature (e.g., 950° C.).

The insulating layers 24 and 24B can also be a polymer, such as polyimide, deposited and planarized using a suitable process (e.g., spin-on-process). In the case of a polymer a representative process includes spinning the polymer onto the front side 14 of the substrate and then onto the backside of the substrate 16. Depending on the material, a representative thickness of the insulating layer 24 can be from about a 100 Å to several mils.

Following formation of the insulating layer 24, conductive layers 26 are formed within the recesses 12. Peripheral edges 28 of the conductive layers 26 are adapted to penetrate native oxide layers on the bumped external contacts 18 (FIG. 3) to contact the underlying metal. The conductive layers 26 can be formed as a layer of a highly conductive metal such as aluminum, titanium, nickel, iridium, copper, gold, tungsten, silver, platinum, palladium, tantalum, molybdenum or alloys of these metals. Rather than being a single layer of metal, the conductive layers 26 can be formed as multi-layered stacks of metals (e.g., bonding layer/barrier layer).

The conductive layers 26 can be formed using a metallization process (e.g., deposition, photopatterning, etching). An exemplary metallization process is disclosed in U.S. Pat. No. 5,607,818, incorporated herein by reference. The conductive layers 36 can also be formed using a plating process, such as electrolytic deposition, or electroless deposition. A representative thickness of the conductive layers 26 is from 600 Å to 20000 Å.

Instead of the above metals, the conductive layers 26 can also comprise a metal silicide, such as $TiSi_2$, $WSi_2$, $TaSi_2$, $MoSi_2$, and $PtSi_2$. In this case, a silicon containing layer and a metal layer can be deposited on the substrate 10, and then reacted to form a metal silicide. An exemplary metal silicide deposition process is disclosed in U.S. Pat. No. 5,686,317, incorporated herein by reference. Still further, other alloys such as TiN, TiW, TiC and NiB can be deposited using CVD or other deposition process.

Figure 1B:
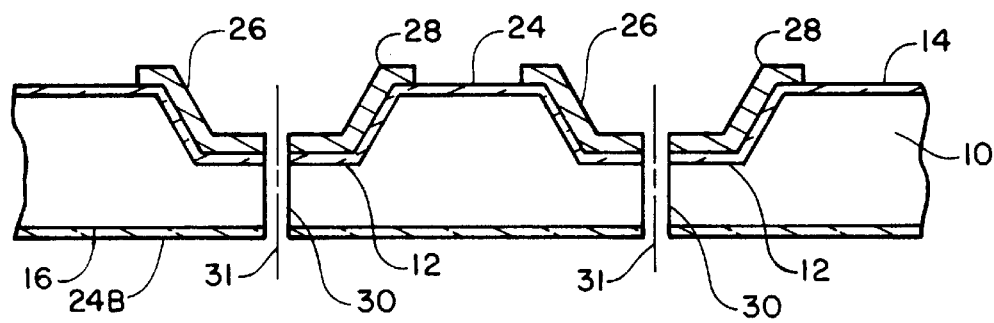

Referring to FIG. 1B, following formation of the conductive layers 26, openings 30 can be formed through the conductive layers 26, and through the substrate 10 to the backside 16 thereof. Preferably the openings 30 are formed using a laser machining process.

A suitable laser machining apparatus is manufactured by General Scanning of Sommerville, Mass. and is designated a model no. 670-W. A representative diameter of the openings 30 is from 10 μm to 2 mils or greater. A representative laser fluence for forming the openings 30 through a substrate 10 comprising silicon and having a thickness of about 28 mils is from 2 to 10 watts/per opening at a pulse duration of 20–25 ns and at a repetition rate of up to several thousand per second. The wavelength of the laser beam 32 can be a standard infrared or green wavelength (e.g., 1064 nm–532 nm).

In FIG. 1B, the openings 30 are generally perpendicular to the face side 14 and backside 16 of the substrate 10. In addition, the openings 30 are located along a longitudinal axis 31 which will be the center line of the completed contacts 32 (FIG. 1D). Alternately, as shown in FIG. 3A, the openings 30 can be offset from the center line of the interconnect contacts 32C. Still further, the openings 30 can be outside of the contacts 32E as in the embodiment shown in FIG. 5.

Figure 1C:
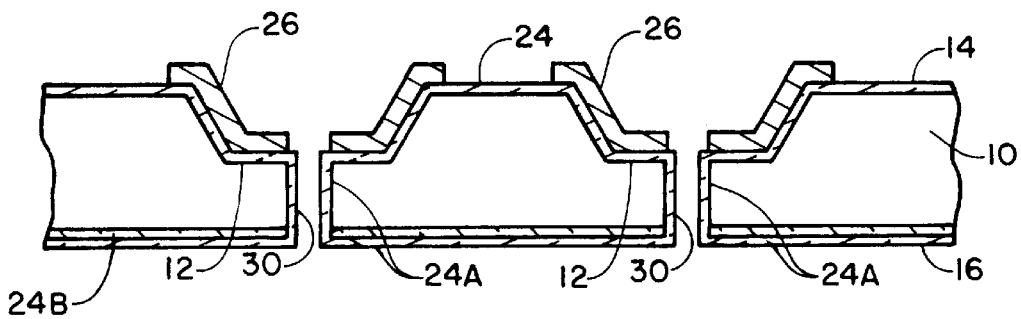
Figure 1D:
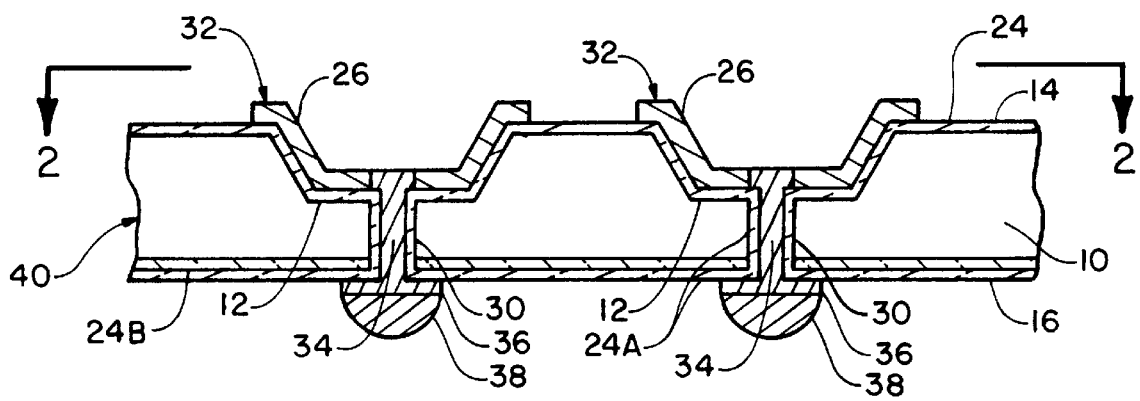

Following formation of the openings 30, and as shown in FIG. 1C, an additional insulating layer 24A can be formed on the inside surfaces of the openings 30, and on the back side 16 of the substrate. With the substrate 10 comprising silicon, the insulating layer 24A can be a grown or deposited oxide, such as $SiO_2$, formed as previously described for insulating layer 24. If the substrate 10 comprises an electrically insulating material, such as ceramic, or a glass filled resin, such as FR-4, the insulating layer 24A (and also 24) is not required.

Figure 3B:
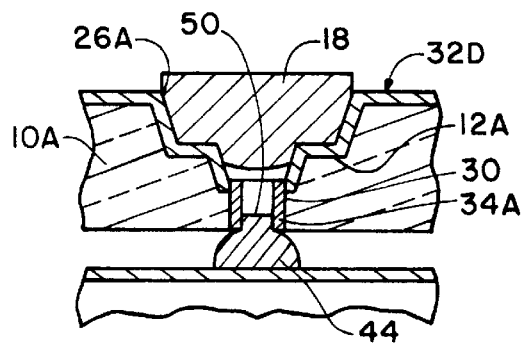
FIG. 3B is an enlarged schematic cross sectional view of an alternate embodiment interconnect contact having a stepped configuration.

Following formation of the insulating layer 24A, and as shown in FIG. 1D, conductive members 34 can be formed within the openings 30. The conductive members 34 can comprise a metal, such as the previously described metals for the conductive layers 26. The metal can be deposited within the openings 30 using a deposition process, such as CVD, electrolytic deposition or electroless deposition. A solder metal can be screen printed in the openings 30, as well as with capillary action, or with a vacuum system using a hot solder wave. In addition, the conductive members 34 can be plugs that completely fill the openings 30, or alternately as shown in FIG. 3B, can be layers that cover just the inside surfaces or sidewalls of the openings 30.

Rather than being a metal, the conductive members 34 can comprise a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the openings 30, as a viscous material, and then cured as required. A suitable deposition process, such as screen printing, or stenciling, can be used to deposit the conductive polymer into the openings 30.

As shown in FIG. 1D, the conductive members 34 are formed within the openings in electrical contact with the conductive layers 26. The conductive members 34 provide straight line electrical paths from the conductive layers 26 to the back side 16 of the substrate 10. The electrical paths in addition to being direct also are insulated from one another by the insulating layers 24A and by the bulk of the substrate 10.

As also shown in FIG. 1D, the conductive members 34 can include pads 36 formed along the back side 16 of the substrate 10. The pads 36 can have a circular, square, rectangular or other peripheral configuration. As also shown in FIG. 1D, the pads 36 can be formed along a center line coincident to an axis 31 (FIG. 1B) of the conductive members 34 and to a center line of the conductive layers 26. As will be further explained in an alternate embodiment the pads 36 can be offset from a center line of the conductive layers 26.

The pads 36 (or 36B) can be formed during formation of the conductive members 34 using a suitable mask (not shown), such as a hard mask, or a stencil mask. For example, a metal can be blanket deposited on the back side 16 of the substrate and into the openings 30 and then etched to form the pads 36 (or 36B). Alternately the pads 36 (or 36B) can comprise a different material than the conductive members 34, and can be formed using a separate deposition process.

In addition to the pads 36 (or 36B), the conductive members 34 can include contact balls 38 formed on the pads 36 (or 36B). The contact balls 38 can be formed of metal or a conductive polymer. The contact balls 38 provide connection points for making electrical connections from the outside to the conductive members 34 and conductive layers 26. If the contact balls 38 are not provided on the pads 36 (or 36B), the electrical connections from the outside can be made directly to the pads 36 (or 36B). As will be further explained, the electrical connections from the outside to the contact balls 38 (or to the pads 36 or 36B if the contact balls 38 are omitted) can be by physical contact with a mating electrical connector (e.g., "POGO PIN") of a test apparatus, or other electrical assembly, that will employ the completed interconnect 40. The electrical connections to the contact balls 38 (or to the pads 36 or 36B) can also be a bonded connection such as a reflowed metal bond, or a cured conductive polymer bond.

The contact balls 38 can be formed of a relatively hard metal such as nickel, copper, beryllium copper, alloys of nickel, alloys of copper, alloys of beryllium copper, nickel-cobalt-iron alloys and iron-nickel alloys. These relatively hard metals will allow the contact balls 38 to resist wear and deformation during continued usage of the interconnect 40. The contact balls 38 can also comprise a base metal and an outer layer formed of a non-oxidizing metal such as gold, silver, copper or palladium. For reflow applications, the contact balls 38 can comprise a solder alloy such as 95%Pb/ 5%Sn, 60%Pb/40%Sn, 63%In/37%Sn, or 62%Pb/36%Sn/ 2%Ag. The contact balls 38 can also be a conductive polymer such as an isotropic or anisotropic adhesive.

One method for attaching the contact balls 38 to the pads 36 is by bonding pre-fabricated metal balls to the pads 36 (or 36B). For example, pre-fabricated metal balls are manufactured by Mitsui Comtek Corp. of Saratoga, Calif. under the trademark "SENJU SPARKLE BALLS". The metal balls can be attached to the pads 36 (or 36B) by soldering, laser reflow, brazing, welding, or applying a conductive adhesive. A solder ball bumper can also be used to bond the contact balls 38 to the pads 36 (or 36B). A suitable solder ball bumper is manufactured by Pac Tech Packaging Technologies of Falkensee, Germany. The contact balls 38 can also be formed on the pads 36 (or 36B) using a conventional wire bonder apparatus adapted to form a ball bond, and then to sever the attached wire. The contact balls 38 can also be formed by electrolytic deposition or electroless deposition of a metal to form bumps.

A representative diameter for the contact balls 38 can be from about 4 mils to 50 mils or more. A pitch of the contact balls 38 can be from about 6 mils to 50 mils or more. In addition, the pitch of the pads 36 and the contact balls 38 can exactly match the pitch of the interconnect contacts 32. Alternately, the pitch of offset pads 36B (FIG. 1E) can be different than the pitch of the interconnect contacts 32. For example, the pitch of the pads 36B can be greater or smaller than the pitch of the contacts 32.

As shown in FIG. 2, the completed interconnect 40 includes a dense array of interconnect contacts 32 formed on the face side 14 of the substrate 10. Each interconnect contact 32 includes an associated opening 30 (FIG. 3) and conductive member 34 (FIG. 3), which provide an insulated electrical path from the conductive layer 26 for the contact 32, to the backside 16 of the substrate 10. By providing the openings 30 and conductive members 34 through the substrate 10, complicated electrical paths on the face side 14 of the interconnect 40 can be eliminated. Also the resultant electrical paths provide less cross talk, fewer parasitic signals, and faster signal transmission. The openings 30 also permit the interconnect contacts 32 to be formed with a pitch small enough to accommodate dense arrays of external contacts 18 (FIG. 3) on semiconductor components 20 (FIG. 3).

The fabrication process illustrated in FIGS. 1A–1D can also be performed in a sequence wherein the recesses 12 and openings 30 are formed in the substrate 10, and then the conductive layers 26 are formed. In this case, the conductive members 34 (FIG. 1D) can be formed at the same time as the conductive layers 26 using the same deposition process. For example, the openings 30 can be formed first, followed by formation of an insulating layer 24. Next, a layer of metal can be blanket deposited on the face side 14 of the substrate 10 and into the openings 30. The metal can then be patterned and etched to form the conductive layers 26 (FIG. 1A). In addition, a metal can then be deposited on the backside 16 of the substrate 10 and patterned to form the pads 36.

Referring to FIG. 3, the interconnect contact 32 is illustrated in electrical engagement with the external contact 18 on the semiconductor component 20. The semiconductor component 20 can be a singulated bare semiconductor die, a semiconductor die contained on a wafer, or a semiconductor die contained in a chip scale package. The component 20 includes a passivation layer 42 on which the external contact 18 has been provided in electrical communication with integrated circuits on the component 20.

As shown in FIG. 3, the interconnect contact 32 comprises the recess 12 in the substrate 10, covered with the conductive layer 26, and sized to electrically engage the bumped external contact 18. The peripheral edge 28 of the conductive layer 26 penetrates native oxide layers present on the bumped external contact 18. As will be further explained, during a test procedure the component 20 and interconnect 40 are biased together to aid in the electrical engagement and penetration of the bumped external contact 18.

The interconnect contact 32 also includes the pad 36 and metal ball 38. However, it is to be understood that the pad 36 and metal ball 38 can be omitted for some applications. As will be further explained, the pad 36 and metal ball 38 allow the interconnect 40 to be placed in electrical communication with corresponding contacts on a test apparatus, such as a test carrier or probe card fixture.

Referring to FIG. 3A, interconnect contact 32C with the penetrating member 22 is illustrated. In this embodiment the penetrating member 22 comprises a blade formed in the substrate 10. The penetrating member 22 is adapted to penetrate the bumped external contact 18 and electrically engage the underlying metal. One method for forming the penetrating member 22 is to etch the substrate 10 at the same time that the recess 12 is etched. For example, an etch mask for etching the recess 12 can include a portion adapted to cover the substrate 10 to form the penetrating member 22. The penetrating member 22 becomes sharper as the etch process proceeds. Also, two or more penetrating members 22, as in the interconnect contact 32B (FIG. 2B), rather than a single penetrating member can be formed in a desired pattern (e.g., cross pattern, parallel spaced pattern) within the same recess 12.

Following etching of the recess 12 and penetrating member 22, both can be covered by the conductive layer 26, as previously described. The opening 30 can then be formed using a laser machining process as previously described. With the interconnect contact 32C illustrated in FIG. 3A, the opening 30 is offset from a center line of the contact 32C. This provides clearance for the penetrating member 22 which can be located along the center line of the contact 32C.

Referring to FIG. 3B, another alternate embodiment interconnect contact 32D is illustrated. The interconnect contact 32D is fabricated essentially as previously described for interconnect contact 32 (FIG. 3). However, in this case the recess 12A is stepped, and the conductive layer 26A is formed over the stepped recess 12A. The stepped recess 12A allows the external contact 18 to deform to accommodate size variations in the external contacts 18. For example, some external contacts 18 may be oversized, and some may be undersized from a desired average diameter. The oversized external contacts 18 can deform into the lower portion of the recess 12A. The undersized external contacts 18 can electrically engage only the upper portion of the recess 12A.

Also with the interconnect contact 32D of FIG. 3B, the substrate 10A comprises ceramic or a glass filled resin, so that insulating layers 24 and 24A (FIG. 3) are not required. In addition, the conductive member 34A comprises a conductive layer deposited on the sidewalls of the opening 30 rather than filling the entire opening 30. The conductive member 34A is configured for mating electrical engagement with an electrical connector 44 of a testing apparatus. The electrical connector 44 comprises a bump with a cylindrical portion 50 adapted to extend into the opening 30, and electrically contact the conductive member 34A. The conductive member 34A can be formed using an ultrasonic forging process as described in U.S. Pat. No. 5,249,450, which is incorporated herein by reference.

Figure 3C:
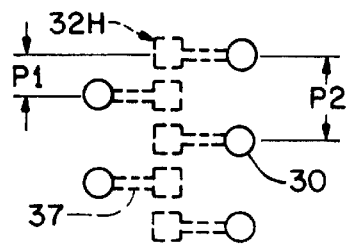
FIG. 3C is a schematic bottom view of alternate embodiment interconnect contacts formed with a pitch (P1) that is offset from a pitch (P2) of laser machined openings for the contacts.

Referring to FIG. 3C, alternate embodiment interconnect contacts 32H are illustrated in a schematic bottom view. The interconnect contacts 32H are fabricated substantially as previously described for interconnect contacts 32 (FIG. 3). However, in this embodiment the axis 31 (FIG. 1B) of the laser machined openings 30 are offset from a center line (or axis) of the interconnect contacts 32H. In addition, the openings 30 are formed in an alternating pattern on opposite sides of adjacent interconnect contacts 32H.

This permits a pitch P1 of the interconnect contacts 32H to match the pitch of the external contacts 18 (FIG. 3) on the component 20 (FIG. 3). However, a pitch P2 of the openings 30 can be double the pitch P1 (P2=2×P1). This arrangement permits an increased pitch P2 for forming electrical connections to the pads 36 (FIG. 3) and contact balls 38 (FIG. 3) for the conductive members 34 (FIG. 3) formed in the openings 30. The increased pitch P2 may be necessary to accommodate the pitch of mating electrical connectors (e.g., "POGO PIN") of a test apparatus, or other electrical assembly, that will employ the completed interconnect.

As also shown in FIG. 3C, conductive traces 37 can be provided to form electrical paths between the interconnect contacts 32H and the conductive members 34 (FIG. 3) within the openings 30. If desired, the conductive traces 37 can be portions of the conductive layers 26 (FIG. 3), or alternately separate members fabricated separately from the conductive layers 26.

Figure 4A:
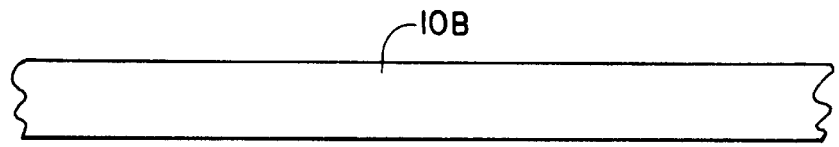
FIGS. 4A–4C are schematic cross sectional views illustrating a method for fabricating an alternate embodiment interconnect.
Figure 4B:
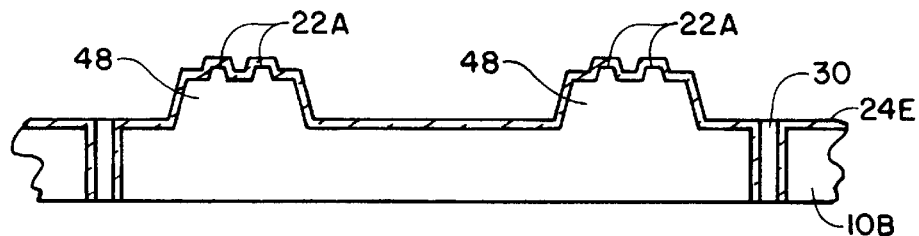
Figure 4C:
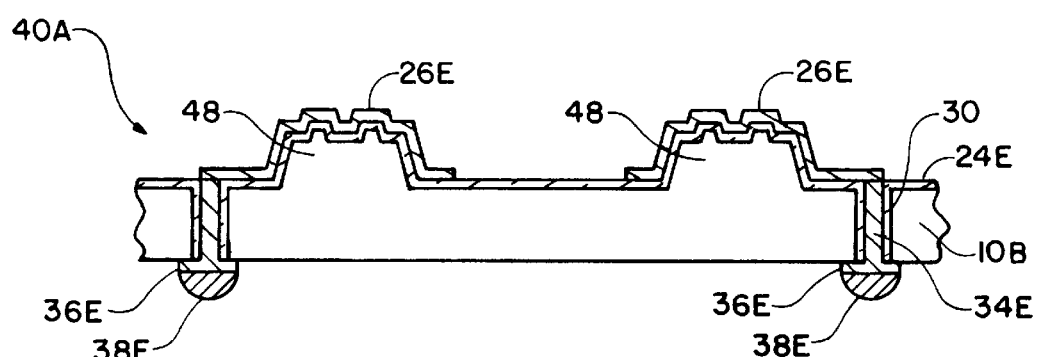

Referring to FIGS. 4A–4C, fabrication of an alternate embodiment interconnect 40A (FIG. 4C) is illustrated. The interconnect 40A includes contacts 32E (FIG. 5) adapted to electrically engage planar external contacts 18A (FIG. 5) on a semiconductor component 20A. In this embodiment the component 20A comprises an unpackaged semiconductor die, and the external contacts 18A comprise thin film bond pads.

Initially as shown in FIG. 4A, a substrate 10B can be provided. As with the previous fabrication process, the substrate 10B is preferably a wafer of silicon on which multiple interconnects 40A can be formed using a wafer level fabrication process. Following fabrication, the individual interconnects 40A can be singulated from the wafer.

Next, as shown in FIG. 4B, projections 48 and penetrating members 22A can be formed on the substrate 10B using an etch process. An etch process for forming the projections 48 and penetrating members 22A is disclosed in previously cited U.S. Pat. No. 5,686,317, which is incorporated herein by reference. The locations of the projections 48 corresponds to the locations of the external contacts 18A (FIG. 5) on the component 20A. The penetrating members 22A are adapted to penetrate the external contacts 18A (FIG. 5) to a limited penetration depth. In addition, the projections 48 are sized and shaped to electrically engage the contacts 18A (FIG. 5) while maintaining separation of the component 20A and substrate 10B of the interconnect 40A. This separation helps to clear particulates and reduce cross talk between the component 20A and interconnect 40A.

Following formation of the projections 48 and penetrating members 22A, the openings 30 can be formed through the substrate 10B using a laser machining process as previously described. With the openings 30 formed, an insulating layer 24E can be formed on the surface of the substrate 10B, and on the sidewalls of the openings 30. The insulating layer 24E also covers the projections 48, and the penetrating members 22A. The insulating layer 24E can be formed using a deposition process, or an oxidation process as previously described for insulating layers 24 and 24A (FIG. 1D).

Next, as shown in FIG. 4C, conductive layers 26E can be formed over the projections 48 and penetrating members 22A. The conductive layers 26E can be formed using the same materials and processes as previously described for conductive layers 26 (FIG. 1A). As also shown in FIG. 4C, conductive members 34E can be formed in the insulated openings 30 using the same materials and processes as previously described for conductive members 34 (FIG. 1D). Each conductive member 34E is in electrical communication with an associated conductive layer 26E. Pads 36E and contact balls 38E can also be formed on the conductive members 34E as previously described for pads 36 (FIG. 1D) and contact balls 38 (FIG. 1D).

Figure 6:
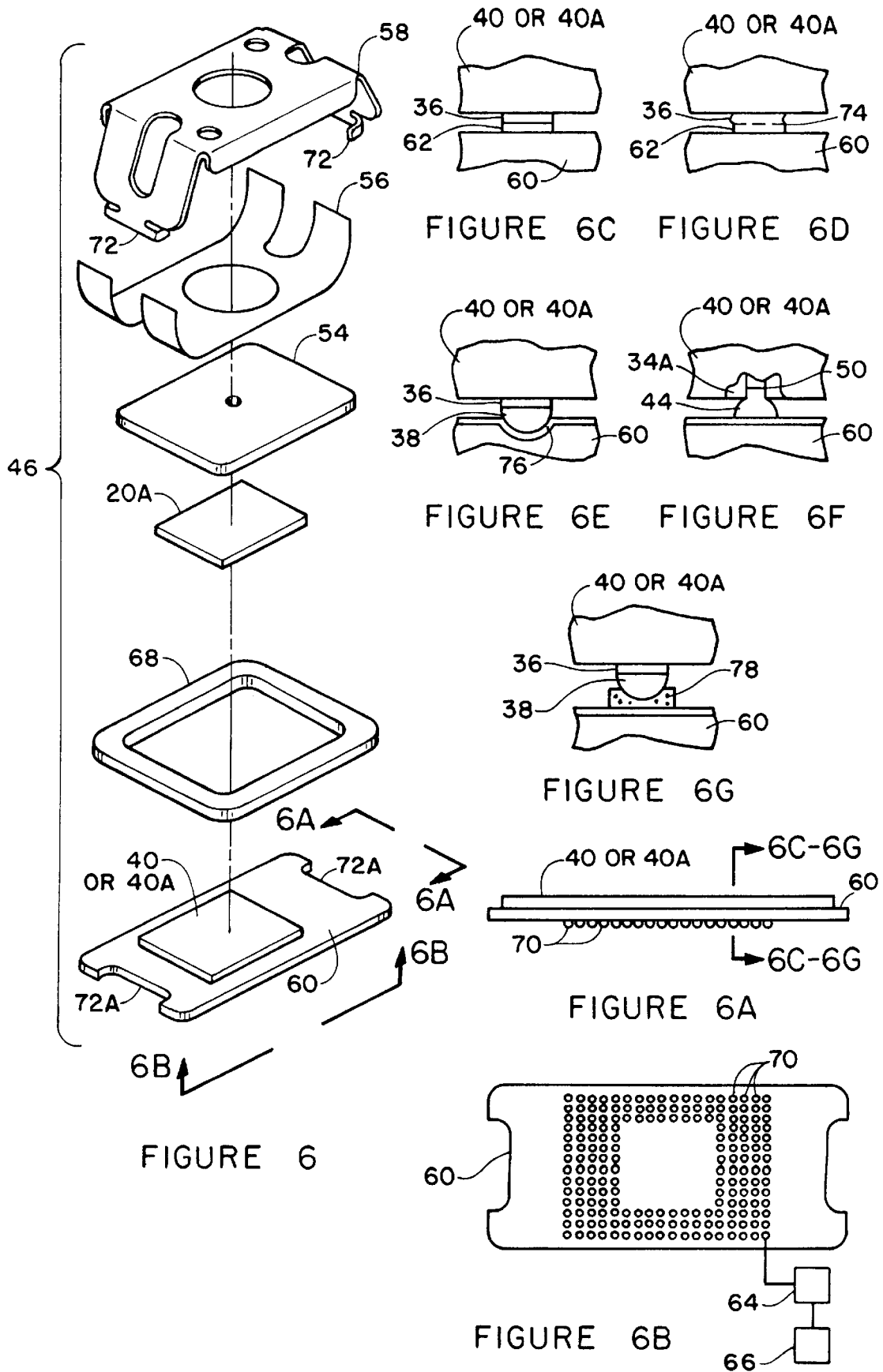
FIG. 6 is an exploded perspective view of a test carrier that includes an interconnect constructed in accordance with the invention.

Referring to FIGS. 6–6G, a test carrier 46 incorporating the interconnect 40 or 40A is illustrated. The carrier 46 is adapted to hold a semiconductor component 20A such as an unpackaged die or a chip scale package. In addition, the carrier 46 is adapted to electrically connect to a test apparatus such as a burn-in board 64 (FIG. 6B) in electrical communication with test circuitry 66 (FIG. 6B). The test circuitry 66 is configured to apply test signals through the carrier 46 and the interconnect 40 or 40A to the component 20A.

The carrier 46 includes a base 60 having a dense array of terminal contacts 70 (FIG. 6B). The terminal contacts 70 electrically mate with corresponding electrical connectors, such as clips or socket contacts, on the burn-in board 64. The carrier 46 also includes a force applying mechanism comprising a pressure plate 54, a spring 56 and a clamp 58. The clamp 58 includes clip portions 72 that mate with clip receiving portions 72A on the base 60. The spring 56 attaches to the clamp 58 and presses the pressure plate 54 against the interconnect 40 or 40A. In the assembled carrier 46, the spring 56, clamp 58 and pressure plate 54 cooperate to bias the component 20A against the interconnect 40 or 40A. In addition, a seal member 68 surrounds the component 20A and interconnect 40 or 40A to prevent contaminants from entering an interior of the assembled carrier 46. U.S. Pat. No. 5,541,525, which is incorporated herein by reference, describes carriers similar in construction to carrier 46.

Assembly of the carrier 46 can be accomplished by optically aligning the component 20A with the interconnect 40 or 40A. A method of assembly using optical alignment is disclosed in U.S. Pat. No. 5,634,267, which is incorporated herein by reference.

In the assembled carrier 46, the interconnect 40 or 40A establishes temporary electrical communication with the component 20A. Prior to assembly of the carrier 46, the interconnect 40 or 40A can be mounted to the carrier base 60 in electrical communication with the terminal contacts 70 on the base 60.

FIGS. 6C–6G illustrate different methods for mounting and electrically connecting the interconnect 40 or 40A to the base 60. In FIG. 6C, the interconnect 40 or 40A includes pads 36, as previously described, which are in electrical communication with the interconnect contacts 32 (FIG. 3). The carrier base 60 also includes pads 62 configured to physically and electrically contact the pads 36 on the interconnect 40 or 40A. The pads 62 (FIG. 6C) on the carrier base 60 are in electrical communication with the terminal contacts 70 (FIG. 6B) on the carrier base 60. The carrier base 60 can include a ceramic, plastic or glass filled resin substrate having internal conductors (not shown) which electrically connect the pads 62 (FIG. 6C) and the terminal contacts 70 (FIG. 6B). In this embodiment the carrier spring 56 (FIG. 6) provides the force for biasing the pads 36 (FIG. 6C) on the interconnect 40 or 40A against the pads 62 (FIG. 6C) on the base 60.

In FIG. 6D, bonded connections 74 are formed between the pads 36 on the interconnect 40 or 40A, and the pads 62 on the carrier base 60. Again the pads 62 on the carrier base 60 are in electrical communication with the terminal contacts 70 (FIG. 6B). The bonded connections 74 can be made by forming one of the pads 36, 62 of solder, and another of the pads 36, 62 of a solder wettable metal, and then reflowing one or both of the pads 36, 62.

In FIG. 6E, the interconnect 40 or 40A includes pads 36 and contact balls 38 as previously described, which are in electrical communication with the interconnect contacts 32 (FIG. 3). The carrier base 60 includes a mating electrical connector 76 in electrical communication with the terminal contacts 70 (FIG. 6B). In addition, the electrical connector 76 includes recesses sized and shaped to retain and electrically engage the contact balls 38. In this embodiment the carrier spring 56 (FIG. 6) provides the force for biasing the contact balls 38 on the interconnect 40 or 40A, against the electrical connectors 76 on the base 60.

In FIG. 6F, the interconnect 40 or 40A includes the conductive member 34A having an opening for receiving the cylindrical portion 50 of electrical connector 44. The electrical connector 44 is in electrical communication with the terminal contacts 70 (FIG. 6B) on the carrier base 60. In this embodiment the carrier spring 56 (FIG. 6) provides the force for biasing the electrical connectors 44 on the base 60 into the openings provided by the conductive members 34A.

In FIG. 6G, the interconnect 40 or 40A includes pads 36 and contact balls 38 as previously described, which are in electrical communication with the interconnect contacts 32 (FIG. 3). The carrier base 60 includes conductive polymer pads 78 in electrical communication with the terminal contacts 70 (FIG. 6B). The conductive polymer pads 78 can be an isotropic adhesive as previously described, or an anisotropic adhesive, such as a z-axis epoxy. In this embodiment, the carrier spring 56 (FIG. 6) provides the force for biasing the metal pads 38 and conductive polymer pads 78 into electrical engagement. Also in this embodiment, a bonded connection can be formed between the metal ball 38 and the conductive polymer pads 78. For bonded connections, the conductive polymer pads 78 can be deposited on the carrier base 60 in a B-stage, or semi-cured condition, and then cured under compression in contact with the metal balls.

Referring to FIGS. 7–7C, a wafer test system 80 constructed in accordance with the invention is shown. The test system 80 is configured to test semiconductor dice 52 contained on a wafer 20W. The test system 80 includes a probe card 82 which includes the interconnect 40 or 40A. The interconnect 40 or 40A makes temporary electrical connections with external contacts 18 or 18A on the wafer 20W. The test system 80 also includes a wafer handler 84, and a tester 86 having test circuitry 88 for applying and analyzing test signals.

The wafer handler 84 interfaces with a test head 90 wherein the probe card 82 is mounted. In addition, the wafer handler 84 includes a wafer chuck 92 configured to move in X and Y directions to align the wafer 20W with the probe card 82, and in the Z direction to move the wafer 20W into contact with the interconnect 40 or 40A. The wafer handler 84 can also include an optical or mechanical alignment system (not shown) for aligning the wafer 20W to the interconnect 40 or 40A. One suitable wafer handler 84 is manufactured by Electroglass and is designated a Model 4080.

The test system 80 also includes a prober interface board 94 for routing test signals from the tester 86 to the test head 90 to the probe card 82. The prober interface board 94 can be mounted to the test head 90. In addition, the prober interface board 94 can be in electrical communication with the tester pin electronics 96 in the test head 90. Separate electrical paths 98 are provided from the test circuitry 88 in the tester 86 to the tester pin electronics 96, and to the prober interface board 94. The prober interface board 94 includes separate electrical paths 98 to the probe card 82.

The probe card 82, generally stated, comprises: a probe card substrate 100, the interconnect 40 or 40A, and a force applying mechanism 102. The probe card substrate 100 preferably comprises an electrically insulating material such as a glass filled resin (e.g., FR-4), a ceramic or plastic. The probe card substrate 100 includes an opening 104 wherein the force applying mechanism 102 is mounted. Viewed from above, the opening 104 is generally rectangular shaped to accommodate a mating rectangular shape of the force applying mechanism 102. However, as is apparent, a rectangular shape is merely exemplary.

The probe card substrate 100 can be attached to a probe card fixture 106 mounted within the test head 90. Threaded fasteners 108 can be used to removably attach the probe card substrate 100 to the probe card fixture 106. If desired, the probe card substrate 100 can be a conventional probe card having the middle portion removed to form the opening 104. The probe card fixture 106 can also be a conventional component. Conventional probe cards and probe card fixtures are available from Packard Hughes Interconnect, Los Angeles, Calif., and Wentworth Laboratories, Sunnyvale, Calif.

The force applying mechanism 102 includes a base 110 which attaches to the probe card substrate 100. In addition, the force applying mechanism 102 includes a plurality of spring loaded electrical connectors 112 mounted to a pin mounting plate 114 attached to the base 110. The electrical connectors 112 physically and electrically engage the pads 36 (FIG. 7A). Alternately, electrical connectors 112A (FIG. 7B) are configured to physically and electrically engage the contact balls 38 (FIG. 7B). The electrical connectors 112 or 112A can be commercially available spring loaded electrical connectors, such as "POGO PINS" manufactured by Pogo Industries of Kansas City, Kans. Other suitable spring loaded electrical connectors include "DURASEAL" connectors manufactured by IDI, Kansas City, Kans. FIG. 7C illustrates the embodiment wherein interconnect contacts 32H are offset from the conductive members 34 as previously explained with reference to FIG. 3C. In this embodiment the pitch of the pads 36 can be increased to match the pitch of the electrical connectors 112.

The interconnect 40 or 40A is slidably mounted to a two piece interconnect support plate 116 that attaches to the probe card substrate 100 with threaded fasteners 118. In addition, spring biased threaded fasteners 120 allow a planarity of the interconnect support plate 116 to be adjusted.

As shown in FIGS. 7A–7C, the interconnect support plate 116 includes an opening 122 formed with a peripheral lip 124 for supporting the interconnect 40 or 40A. The interconnect 40 or 40A includes a stepped surface 126 that engages the lip 124 and allows the interconnect contacts 32E (FIG. 7A) or 32 (FIG. 7B) to project from the interconnect support plate 116. The stepped surface 126 of the interconnect 40 or 40A can be formed by an etching process during fabrication of the interconnect 40 or 40A.

The peripheral lip 124 of the interconnect support plate 116 prevents the interconnect 40 or 40A from separating from the interconnect support plate 116. However, the interconnect 40 or 40A is movable within the opening 122 in the Z-direction towards the electrical connectors 112. The opening 122 can be sized to prevent excessive movement of the interconnect 40 or 40A in the X and Y directions. If desired, dots of a compliant material such as silicone can be placed in a gap between the interconnect 40 or 40A and opening 122. The dots of compliant material can be used to retain the interconnect 40 or 40A while allowing some Z-direction movement of the interconnect 40 or 40A.

The interconnect 40 or 40A is maintained in a stationary position within the opening 122 by spring pressure exerted by the electrical connectors 112 or 112A. However, during a test procedure, the wafer 20W can be overdriven in the Z-direction with respect to the interconnect 40 or 40A, to move the interconnect 40 or 40A in the Z-direction towards the electrical connectors 112 or 112A. With the Z-direction overdrive, a contact force (F) with which the interconnect contacts 32E (FIG. 7E) or 32 (FIG. 7B) press into the external contacts 18A or 18 is generated by compression of the spring components of the electrical connectors 112 or 112A.

The force F exerted by the electrical connectors 112 or 112A will be dependent on a spring constant, and amount of compression, of the spring components of the electrical connectors 112 or 112A. A representative value for the force F can be from 0.10 oz to 1.5 oz per electrical connector 112 or 112A. As used herein, the term Z-direction overdrive refers to movement of the wafer 20W or probe card 82 towards one another past the initial point of contact between the interconnect contacts 32E or 32 and the external contacts 18A or 18. The Z-direction overdrive determines the amount of compression in the spring components of the electrical connectors 112 or 112A and thus the magnitude of the force F. A representative amount of Z-direction overdrive can be from 0.25 mils to 8 mils. Depending on the initial Z-direction location of the electrical connectors 112 or 112A, the force F can include two components F1 and F2. F1 is the force applied by the electrical connectors 112 or 112A without overdrive. F2 is the force applied by the electrical connectors 112 or 112A from being deflected by the Z-direction overdrive distance.

Referring to FIG. 8, a chip scale package 130 constructed in accordance with the invention is illustrated. The chip scale package 130 includes a conventional semiconductor die 20D having a face with bumped external contacts 18 formed thereon as previously described. The chip scale package 130 also includes an interconnect 40C attached to the die 20D. The interconnect 40C comprises a substrate 10C having interconnect contacts 32F configured to electrically engage the bumped external contacts 18. The interconnect contacts 32F can be bonded to the bumped external contacts 18 using a compressive, or a non-compressive, bonding technique. The interconnect 40C also includes conductive members 34C in electrical communication with external contact balls 38C. An underfill layer 128 can be used to fill the gap between the interconnect 40C and the die 20D. One suitable underfill material is "HYSOL BRAND FP4520" sold by Dexter Electronic Materials.

Figure 9A:
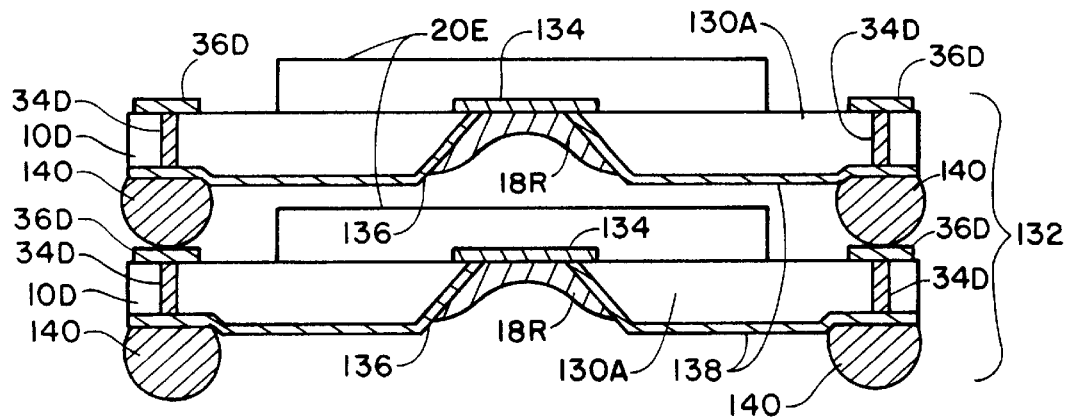
FIGS. 9A–9E are schematic cross sectional views of multi chip modules constructed in accordance with the invention.

Referring to FIG. 9A, a chip scale package 130A and a multi chip module 132 constructed in accordance with the invention is illustrated. The multi chip module 132 includes two or more chip scale packages 130A in a stacked configuration. Each chip scale package 130A includes an interconnect substrate 10D and a semiconductor die 20E. The interconnect substrate 10D can be fabricated substantially as previously described for substrate 10 (FIG. 1A).

Each interconnect substrate 10D includes patterns of conductors 138 having external bumps 140 formed thereon. Each interconnect substrate 10D also includes an interconnect opening 136 wherein reflowed external contacts 18R on bond pads 134 of the dice 20E are bonded to the conductors 138 on the substrate 10D. The chip scale packages 130A can be fabricated substantially as described in U.S. Pat. No. 5,674,785, which is incorporated herein by reference.

Each interconnect substrate 10D also includes conductive members 34D and pads 36D in electrical communication with the conductors 138. The conductive members 34D and pads 36D can be fabricated substantially as previously described for conductive members 34 and pads 36 shown in FIG. 1D. The external bumps 140 can comprise a metal, or a conductive polymer, configured to form bonded connections with the pads 36D on the conductive members 34D.

The bonded connections, for example, can be formed by a non-compressive process, such as reflowing bumps 140 formed of solder, onto pads 36D formed of a solder wettable material. Alternately, a compressive process such as thermocompression bonding, or thermosonic bonding, can be employed. As another alternative, the bonded connections can be formed by fabricating the bumps 140, or the pads 36D, of a conductive polymer. The conductive polymer can be deposited in a viscous or semi-cured condition, and then fully cured in physical contact with the mating bumps 140 or pads 36D on the adjacent chip scale package 130A.

Figure 9B:
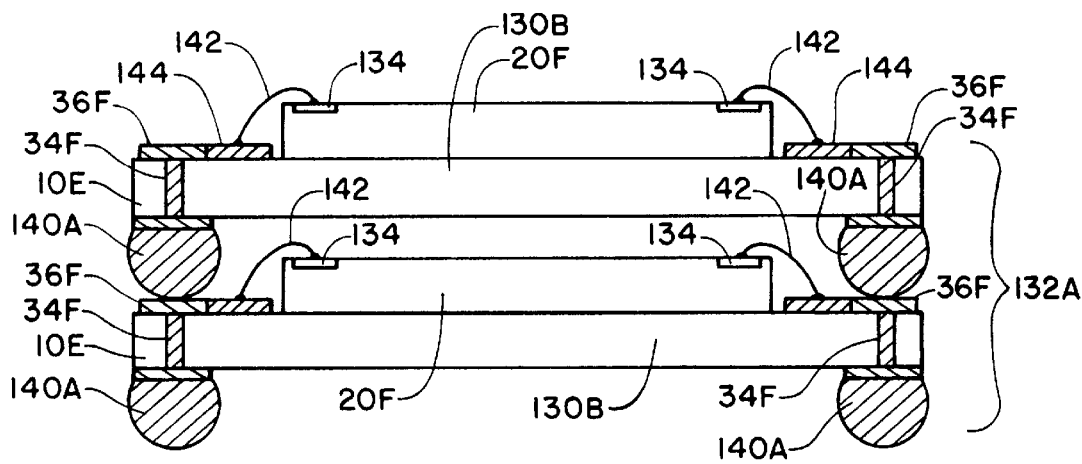

Referring to FIG. 9B, a second multi chip module 132A is illustrated. The multi chip module 132A includes two or more stacked chip scale packages 130B. Each chip scale package 130B includes a semiconductor die 20F mounted to an interconnect substrate 10E in a chip on board configuration. The interconnect substrate 10E can be fabricated substantially as previously described for substrate 10 (FIG. 1A).

With the chip on board configuration illustrated in FIG. 9B, wires 142 are wire bonded to the bond pads 134 on the dice 20F, and to corresponding bond pads 144 on the interconnect substrate 10E. Rather than employing a chip on board configuration, a bumped die can be mounted to an interconnect substrate in a flip chip configuration substantially as shown in FIG. 8.

As also shown in FIG. 9B, the interconnect substrate 10E includes pads 36F in electrical communication with the bond pads 144. In addition, the interconnect substrate 10E includes conductive members 34F in electrical communication with the pads 36F. The conductive members 34F and pads 36F can be fabricated substantially as previously described for the conductive members 34 and pads 36 shown in FIG. 1D.

As with the embodiment of FIG. 9A, the external bumps 140A shown in FIG. 9B can comprise a metal, or a conductive polymer, configured to form bonded connections with the pads 36F on the adjacent chip scale package 130B. The bonded connections, for example, can be formed by a non-compressive process, such as reflowing bumps 140A formed of solder onto pads 36F formed of a solder wettable material. Alternately, a compressive process such as thermocompression bonding, thermosonic bonding, or conductive polymer bonding, as previously described can be employed.

Figure 5:
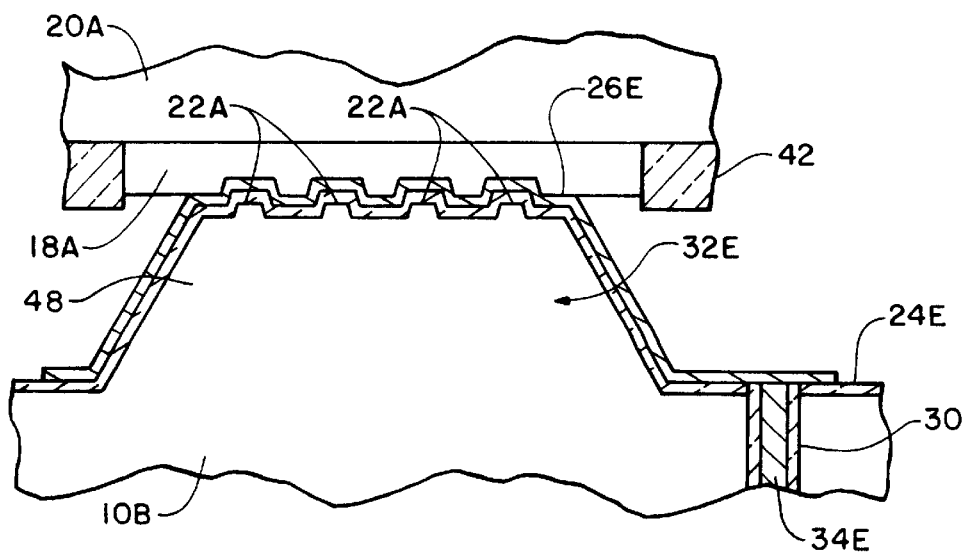
FIG. 5 is a schematic cross sectional view illustrating an interconnect contact for the interconnect of FIGS. 4A–4C electrically engaging a planar external contact on a semiconductor component.
Figure 9C:
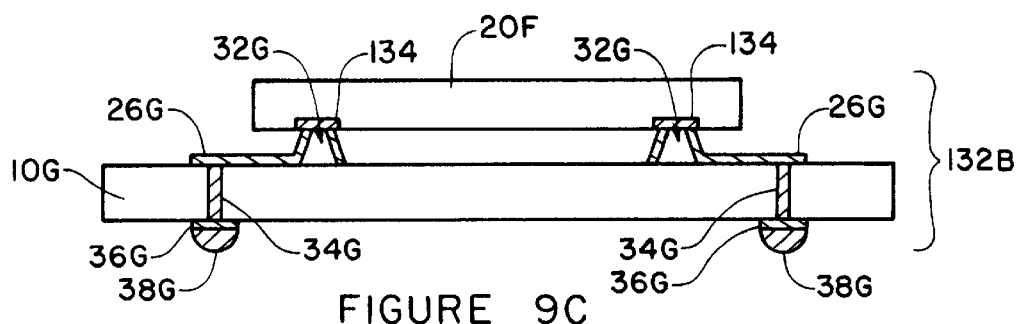

Referring to FIG. 9C, another multi chip module 132B is illustrated. The multi chip module 132B includes an interconnect substrate 10G having interconnect contacts 32G comprising projections covered with conductive layers 26G. The contacts 32G are formed substantially as previously described for interconnect contacts 32E (FIG. 5). Multiple patterns of contacts 32G are formed on the substrate 10G such that multiple semiconductor dice 20F can be mounted to the substrate 10G. The contacts 32G establish electrical communication with the bond pads 134 on the dice 20F. A similar multi chip module is described in U.S. Pat. No. 5,578,526, which is incorporated herein by reference.

The interconnect substrate 10G also includes conductive members 34G in electrical contact with the conductive layers 26G. The conductive members 34G can be fabricated substantially as previously described for conductive members 34 (FIG. 1D). The pads 36G and contact balls 38G can also be fabricated as previously described. In addition, two or more multi chip modules 132B can be bonded to one another in a stacked configuration as previously described for multi chip modules 132 (FIG. 9A) and 132A (FIG. 9B).

Figures 9D, 9E:
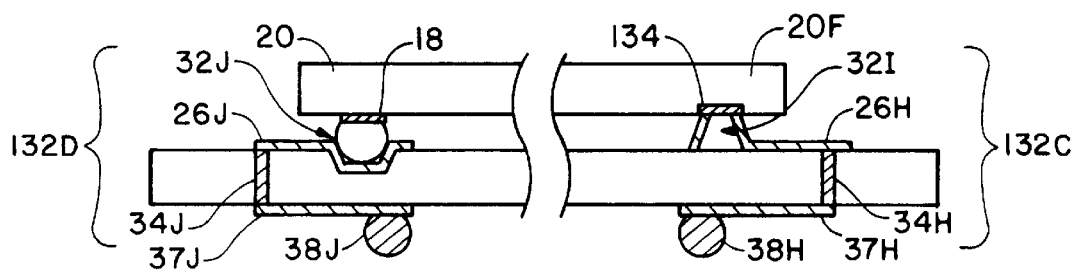

FIG. 9D illustrates a multi chip module 132C in which bond pads 134 on multiple components 20F are electrically engaged by interconnect contacts 32I, substantially as previously described for multi chip module 132B (FIG. 9C). In addition, conductive members 34H are offset from the contacts 32I and from contact balls 38H. Conductive layers 26H establish electrical communication between the conductive members 34H and the contacts 32I. Conductive traces 37H establish electrical communication between the conductive members 34H and the contact balls 38H.

FIG. 9E illustrates a multi chip module 132D in which external contacts 18 on multiple components 20 are electrically engaged by contacts 32J, substantially as previously described for package 130 (FIG. 8). In addition, conductive members 34J are offset from the contacts 32J and from contact balls 38J. Conductive layers 26J establish electrical communication between the conductive members 34J and the contacts 32J. Conductive traces 37J establish electrical communication between the conductive members 34J and the contact balls 38J.

Thus the invention provides an interconnect for semiconductor components and test system employing the interconnect. The interconnect can also be used to electrically engage semiconductor components in the construction of chip scale packages and other electrical components, such as multi chip modules.

Although the invention has been described with reference to certain preferred embodiments, as will be apparent to those skilled in the art, certain changes and modifications can be made without departing from the scope of the invention as defined by the following claims.

We claim:

1. A method for fabricating an interconnect for a semiconductor component having a bumped contact comprising:

providing a substrate comprising a first side and an opposing second side;

forming a recess in the first side configured to retain the bumped contact;

forming a conductive layer within the recess configured to electrically engage the bumped contact;

laser machining an opening through the substrate to the second side;

depositing a conductive material in the opening in contact with the conductive layer; and forming a contact on the second surface in electrical communication with the conductive material;

the opening and the conductive material providing a straight line electrical path between the conductive layer and the contact.

2. The method of claim 1 wherein the recess has a center line and the opening has an axis along the center line.

3. The method of claim 1 further comprising forming a penetrating member in the recess at least partially covered by the conductive layer and configured to penetrate the bumped contact retained in the recess.

4. The method of claim 1 wherein the recess has a centerline and the opening has an axis offset from the centerline.

5. The method of claim 1 wherein the contact comprises an electrically conductive pad.

6. The method of claim 1 wherein the contact comprises an electrically conductive bump.

7. A method for fabricating an interconnect for a semiconductor component having a bumped contact comprising:

providing a silicon substrate comprising a first surface and an opposing second surface;

forming a recess in the first surface sized to retain the bumped contact and having a center line;

depositing a conductive layer within the recess configured to electrically engage the bumped contact;

laser machining an opening within the recess extending through the substrate generally perpendicular to the first side and to the second side;

forming a conductive material in the opening in contact with the conductive layer; and forming a second contact on the second surface in electrical communication with the conductive material such that a straight line electrical path is provided between the conductive layer and the second contact.

8. A method for fabricating an interconnect for a semiconductor component having a planar contact comprising:

providing a substrate comprising a first side and an opposing second side;

forming a first contact on the first side comprising a projection at least partially covered with a conductive layer configured to electrically engage the planar contact and a penetrating member on the projection at least partially covered by the conductive layer configured to penetrate the planar contact;

laser machining an opening through the substrate extending from the first side to the second side; and forming a conductive material in the opening in electrical communication with the conductive layer such that a straight line electrical path is provided through the substrate to the first contact.

9. The method of claim 8 wherein the substrate comprises silicon.

10. The method of claim 8 further comprising forming a second contact on the second side in electrical communication with the conductive material.

11. The method of claim 8 further comprising forming a bumped contact on the second side in electrical communication with the conductive material.

12. The method of claim 8 further comprising forming a contact pad on the second side in electrical communication with the conductive material and offset from a center line of the projection.

13. The method of claim 8 further comprising forming a contact ball on the second side in electrical communication with the conductive material.

14. The method of claim 8 further comprising forming a metal contact ball on the second side in electrical communication with the conductive material.

15. A method for fabricating an interconnect for a semiconductor component having a bumped contact comprising:

providing a substrate comprising a first side and an opposing second side;

forming a first contact on the first side comprising a recess at least partially covered with a conductive layer configured to electrically engage the bumped contact and a penetrating member in the recess at least partially covered by the conductive layer configured to penetrate the bumped contact;

laser machining an opening through the recess extending from the recess to the second side;

depositing a conductive material in the opening in contact with the conductive layer; and forming a second contact on the second side in electrical communication with the first contact;

the opening and the conductive material providing a straight line electrical path between the first contact and the second contact.

16. The method of claim 15 wherein the substrate comprises silicon.

17. A method for fabricating an interconnect for a semiconductor component having a bumped contact comprising:

providing a substrate comprising a first side and an opposing second side;

forming a first contact on the first side comprising a recess at least partially covered with a conductive layer configured to electrically engage the bumped contact;

laser machining an opening through the conductive layer, through the recess and through the substrate to the second side;

forming an insulating layer on an inside surface of the opening;

depositing a conductive material on the insulating layer in electrical communication with the conductive layer; and forming a second contact on the second side in electrical communication with the conductive material;

the opening and the conductive material providing a straight line electrical path between the first contact and the second contact.

18. The method of claim 17 wherein the substrate comprises silicon.

19. A method for fabricating an interconnect for a semiconductor component having a bumped contact comprising:

providing a substrate comprising a first side and an opposing second side;

forming a contact on the first side comprising a stepped recess at least partially covered with a conductive layer configured to retain and electrically engage the bumped contact;

laser machining an opening through the conductive layer, through the stepped recess and through the substrate generally perpendicular to the first side and to the second side; and depositing a conductive material in the opening in electrical communication with the conductive layer;

the opening and the conductive material providing a straight line electrical path through the substrate to the contact.

20. A method for fabricating an interconnect for a semiconductor component having a bumped contact comprising:

providing a substrate comprising a first side and an opposing second side;

forming a recess in the first side sized to retain the bumped contact and having a center line;

forming a penetrating member in the recess configured to penetrate the bumped contact;

depositing a conductive layer within the recess and on the penetrating member configured to electrically engage the bumped contact;

laser machining an opening through the conductive layer, through the recess and through the substrate generally perpendicular to the first side and to the second side and having an axis offset from the center line; and depositing a conductive material in the opening in electrical communication with the conductive layer;

the opening and the conductive material providing a straight line electrical path through the substrate to the conductive layer.

21. The method of claim 20 further comprising following the laser machining step forming an electrically insulating layer on a surface of the opening and depositing the conductive material on the surface.

22. The method of claim 20 wherein depositing the conductive material comprises chemically vapor depositing a metal into the opening.

23. The method of claim 20 wherein depositing the conductive material comprises stenciling a conductive polymer into the opening.

24. The method of claim 20 further comprising forming an electrically conductive pad on the second side in electrical communication with the conductive material.

25. The method of claim 20 further comprising following forming the conductive material, forming a contact ball on the second side in electrical communication with the conductive material.

26. The method of claim 20 further comprising attaching the interconnect to the semiconductor component to form a package.

27. The method of claim 20 further comprising mounting the interconnect to a test carrier configured to house the component for testing.

28. The method of claim 20 further comprising mounting the interconnect to a wafer handler configured to test the component.

29. A method for fabricating an interconnect for a semiconductor component having a plurality of bumped contacts comprising:

providing a substrate comprising a first surface and a second surface;

forming a plurality of first contacts on the first surface comprising a plurality of recesses at least partially covered with conductive layers configured to electrically engage the bumped contacts, the recesses having a first pitch;

laser machining a plurality of openings through the substrate generally perpendicular to the first surface and to the second surface, the openings having a second pitch;

forming a plurality of conductive members within the openings in electrical communication with the conductive layers; and forming a plurality of second contacts on the second surface in electrical communication with the conductive members, the second contacts having the second pitch.

30. The method of claim 29 wherein the second contacts are formed in an alternating pattern on either side of adjacent first contacts.

* * * * *